United States Patent [19]

Colles

[11] Patent Number: 4,638,241
[45] Date of Patent: Jan. 20, 1987

[54] REGULATED CURRENT SUPPLY

[75] Inventor: Joseph H. Colles, Oceanside, Calif.

[73] Assignee: Brooktree Corporation, San Diego, Calif.

[21] Appl. No.: 775,524

[22] Filed: Sep. 13, 1985

[51] Int. Cl.<sup>4</sup> ............................................. G05F 3/08
[52] U.S. Cl. ............................. 323/312; 340/347 DA; 307/297
[58] Field of Search ....................... 323/312, 315, 316; 340/347 DA; 307/296 R, 297, 304

[56] References Cited

U.S. PATENT DOCUMENTS

| 3,813,595 | 5/1974 | Sheng | 323/312 |
| 4,318,040 | 3/1982 | Hilbourne | 323/312 |

FOREIGN PATENT DOCUMENTS

| 0201119 | 11/1983 | Japan | 323/312 |
| 0669344 | 6/1979 | U.S.S.R. | 323/312 |

Primary Examiner—Peter S. Wong
Attorney, Agent, or Firm—Ellsworth R. Roston; Charles H. Schwartz

[57] ABSTRACT

A first semi-conductor has a first threshold voltage and provides a particular voltage drop across it in its saturated state of operation. A second semi-conductor has a second threshold voltage and provides the particular voltage drop across it in its saturated state of operation. The second semi-conductor may be a native device. The first and second semi-conductors are connected to provide a common flow of current. A current is induced, as by a third semi-conductor, to flow in the second semi-conductor. The first and second semi-conductors are commonly biased to produce a flow of saturated current through them when a current is induced to flow in the second semi-conductor. Each of the first, second and third semi-conductors may be provided with a gate, drain and source. The sources and drains of the semi-conductors may be in series. The gates of the first and second semi-conductors may be commonly biased and the gate of the third semi-conductor may be biased to produce the flow of current through the second and third semi-conductors. A circuit may be connected across the first semi-conductor and may be provided with first and second states of operation. In the first state, the saturated current flows through the third, second and first semi-conductors and, in the second state, the saturated current flows through the third and second semi-conductors and the parallel circuit. The parallel circuit may be included in a digital-to-analog converter in which bits are disposed in rows and columns and in which an analog value is produced by activating bits in selected rows and columns.

22 Claims, 4 Drawing Figures

REGULATED CURRENT SUPPLY

This invention relates to circuitry for providing a regulated flow of current. More particularly, the invention relates to circuitry employing native devices on integrated circuit chips for producing a substantially constant flow of current through the native devices even with significant changes in the voltage energizing the circuit.

Since their introduction approximately two (2) decades ago, integrated circuits have had a spectacular growth in volume. Billions and even trillions of integrated circuit chips are manufactured, sold and used every year. As the uses of the integrated circuit chips have expanded, the size of the circuits on the chips has progressively decreased in size. For example, the thickness of electrical lines on the chips are now in the order of two (2) microns and hundreds and even thousands of semi-conductors are disposed on a chip no larger than $\frac{1}{4}'' \times \frac{1}{4}''$ in area. As a result, complex and sophisticated circuits not previously capable of use are becoming widespread in data processing and control systems.

In view of their sophistication, the complex circuitry now often in use on integrated circuit chips requires the flow of regulated amounts of currents through the circuits. This has been difficult to provide, particularly since the voltages energizing the circuits are often variable through relatively wide ranges of values. This problem has been recognized for some time and a considerable effort has been made in this period of time to provide circuitry which will overcome the disadvantages specified above. In spite of such efforts, the problem has persisted.

This invention provides an electrical circuit which overcomes the disadvantages specified above. It provides a substantially constant current even when the voltage energizing the circuit has significant variations such as in the order of at least ten percent (10%) above and below a median value. The circuit is reliable in operation and relatively straightforward in construction. The circuit operates on the difference in voltage between a pair of semi-conductors, one of which constitutes a native device, to obtain the regulated current.

A first semi-conductor has a first threshold voltage and provides a particular voltage drop across it in its saturated state of operation. A second semi-conductor has a second threshold voltage and provides the particular voltage drop across it in its saturated state of operation. The second semi-conductor may be a native device. The first and second semi-conductors are connected to provide a common flow of current. A current is induced, as by a third semi-conductor, to flow in the second semi-conductor. The first and second semi-conductors are commonly biased to produce a flow of saturated current through them when a current is induced to flow in the second semi-conductor.

Each of the first, second and third semi-conductors may be provided with a gate, drain and source. The sources and drains of the semi-conductors may be in series. The gates of the first and second semi-conductors may be commonly biased and the gate of the third semi-conductor may be biased to produce the flow of current through the second and third semi-conductors.

A circuit may be connected across the first semi-conductor and may be provided with first and second states of operation. In the first state, the saturated current flows through the third, second and first semi-conductors and, in the second state, the saturated current flows through the third and second semi-conductors and the parallel circuit. The parallel circuit may be included in a digital-to-analog converter in which bits are disposed in rows and columns and in which an analog value is produced by activating bits in selected rows and columns. In the drawings.

Figure 4:
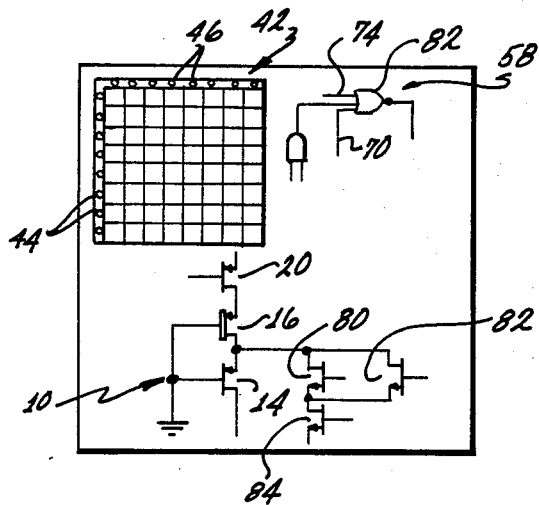

FIG. 4 schematically shows an integrated circuit chip and the disposition of the circuits of this invention on the chip.

Figure 1:
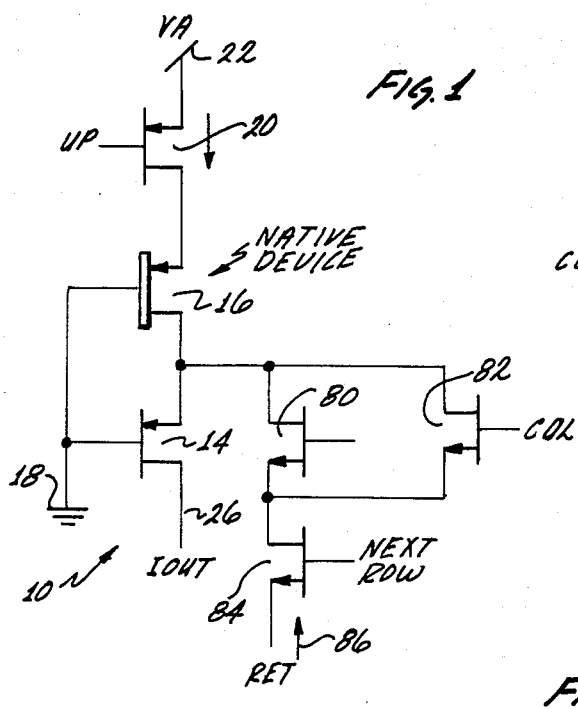
FIG. 1 is a diagram of a circuit constituting one embodiment of an invention for producing a regulated current.

FIG. 1 shows an embodiment of a circuit, generally indicated at 10, for producing a regulated flow of current. The circuit 10 may be disposed on an integrated circuit chip 12 as schematically illustrated in FIG. 4. Circuits including the circuitry 10 may be formed on the chip 12 in C-MOS technology.

The circuit 10 may include a first semi-conductor 14 constructed in a normal manner. The semi-conductor 14 may have a threshold voltage $V_T$ and may produce a voltage $\Delta$ across the transistor when a saturated current flows through the transistor. The threshold voltage $V_T$ may constitute the voltage required to produce a state of conductivity in the transistor. For example, when the semi-conductor 14 is manufactured by VLSI Technology of San Jose, California, the threshold voltage $V_T$ may be substantially 0.7 volts. The semi-conductor 14 may constitute a p-type and may include a drain, a gate and a source.

The circuit 10 may also include a second semi-conductor 16 constituting a native device. Specifically, the semi-conductor 16 may have the same dimensions and characteristics as the semi-conductor 14 except that it may have one less ion implantation than the semi-conductor 14. The semi-conductor 16 may have the same voltage drop $\Delta$ in the saturated state as the semi-conductor 14. However, the threshold voltage of the semi-conductor 16 is different from the threshold voltage of the semi-conductor 14. For example, the threshold voltage of the semi-conductor 16 may be 1.5 volts. The semi-conductor 16 may have a drain, a gate and a source and may be a p-type. The semi-conductor 16 may also be manufactured by VLSI Technology.

The gates of the semi-conductors 14 and 16 have a common biasing voltage such as a ground 18. The source of the semi-conductor 14 and the drain of the semi-conductor 16 have a common connection. The source of the semi-conductor 16 is in turn connected to the drain of a semi-conductor 20, which may also be a p-type. The source of the semi-conductor 20 receives an energizing voltage from a voltage supply 22. This energizing voltage may have a magnitude of approximately five (5) volts. The gate of the semi-conductor 20 is connected to a line 24 which may be biased to make the semi-conductor 20 conductive.

The bias on the semi-conductor 20 is such as to make the semi-conductor conductive even when the voltage from the voltage supply 22 varies by at least ten percent (10%) above and below a median value such as five (5) volts. When the semi-conductor 20 is conductive, it produces a flow of current through the semi-conductors 16 and 14. Because of the difference in threshold voltages between the semi-conductors 16 and 14 and because the voltage drops in the semi-conductors in their saturated states are less than the threshold voltages, the flow of current in the semi-conductor 20 causes a saturated current to flow through a circuit including the semi-conductors 20, 16 and 14. This current flows through an output line 26 connected to the drain of the transistor 14.

Since a saturated current flows through the semi-conductors 16 and 14, this current is substantially constant even with considerable variations in the voltage from the voltage supply 22. This flow of a saturated current is initiated by a current through the semi-conductor 20, which may be considered to be a current-producing means. It will be appreciated, however, that other types of current-producing means than the semi-conductor 20 can be used.

Figure 3:
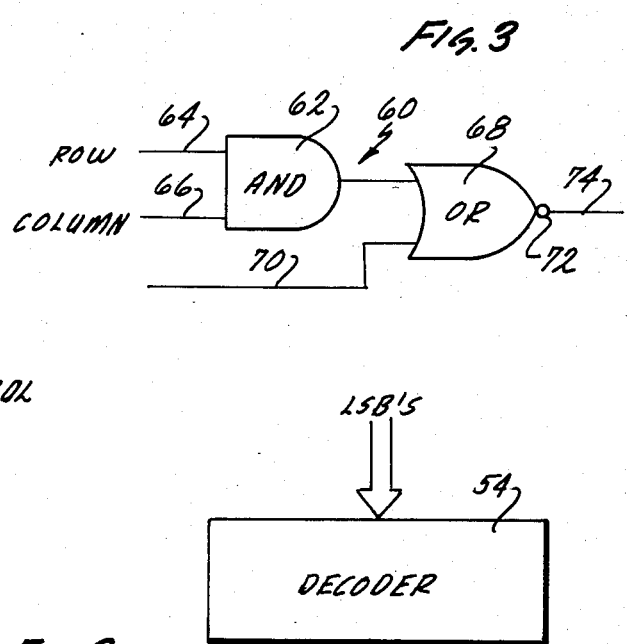
FIG. 3 is a diagram of a circuit which may be used in conjunction with the converter shown in FIG. 2.
Figure 2:
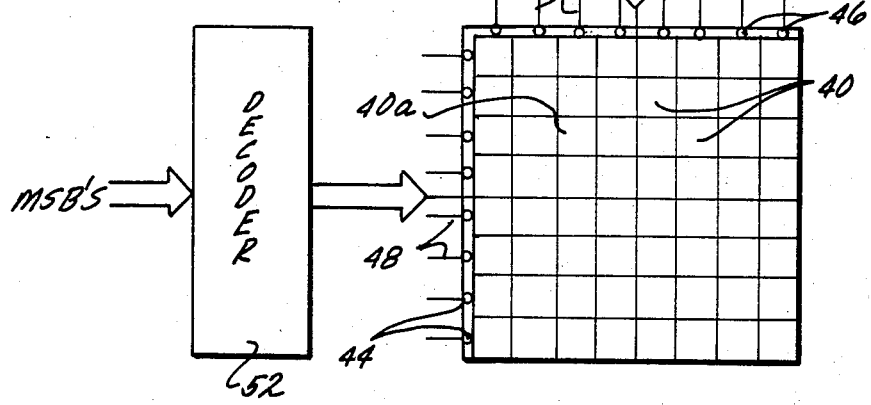
FIG. 2 is a schematic diagram of a digital-to-analog converter which may be used in conjunction with the circuit of FIG. 1.

The circuit 10 may be used in a digital-to-analog converter to provide the output currents which indicate the analog value. An illustrative type of converter is illustrated in FIGS. 2 and 3. In the embodiment of the invention shown in FIG. 2, a plurality of output members 40 are disposed in a matrix arrangement generally indicated at 42. Each of the output members may be a transistor such as disclosed in application Ser. No. 383,544 filed by Henry Katzenstein or a capacitor such as disclosed in application Ser. No. 553,041 filed by Henry Katzenstein. Applications Ser. Nos. 383,544 and 553,041 are assigned of record to the assignee of record of this application.

The matrix arrangement 42 may be in any form. In the embodiment shown in FIG. 2, the matrix arrangement is defined by a plurality of rows and a plurality of columns. The matrix arrangement shown in FIG. 2 provides eight rows and eight columns but any number of rows or columns may be used. Input terminals 44 are provided to each of the rows and input terminals 46 are provided to each of the columns.

Input signals in a first plurality are introduced through lines 48 to the input terminals 44 and input signals are introduced through lines 50 to the input terminals 46. The input signals to the lines 48 have a first logic level indicative of a binary "1" and a second logic level indicative of a binary "0". These signals prepare all of the output members 40 to become activated in the rows receiving these signals.

The input signals in the lines 48 may be obtained by decoding three (3) binary signals which are coded in a pattern to indicate the particular rows to be prepared for activation at each instant. The three signals are introduced to a decoder 52 which operates to decode the signals into the eight signals, some having a logic level of "1" and others having a logic level of "0", which are introduced to the inputs 44. The decoder 52 is constructed to produce simultaneously on a plurality of the lines 48 first signals having a logic level indicative of the binary value "1" and second signals having a logic level indicative of the binary value "0". For example, when the analog value to be decoded is "19", signals having a logic level of "1" are simultaneously produced on the upper three of the lines 48 in FIG. 2 and signals having a logic level of "0" are concurrently produced on the other lines 48.

In like manner, a decoder 54 is provided to decode three input signals in a second plurality. The three (3) input signals in the second plurality are decoded into eight signals which are introduced to the inputs 46. These signals also have logic levels indicative of binary values of "1" and "0". The signals introduced to the decoder 54 may constitute least significant bits (LSB's in FIG. 2) and the signals introduced to the decoder 52 may constitute most significant bits (MSB's in FIG. 2).

As will be seen, when a row and a column are prepared for activation by the introduction of a signal indicative of a binary "1" to the inputs individual to such row and column, a particular one of the output members 40 common to the prepared row and the prepared column becomes activated. For example, an output member 40a common to the third row and the third column may be activated at a particular instant. If this is the output member of highest analog significance to be activated, this indicates that the analog value is "19" since the output member 40a is the nineteenth output member counting (in the form of a raster scan) from the top row and the left column as a starting position. At the same time that the output member 40a is activated, all of the eighteen (18) output members preceding the output member 40a in the matrix relationship shown in FIG. 2 are also activated.

FIG. 3 illustrates a circuit, generally indicated at 60, which is used in a repetitive manner for the different output members 40 to activate output members such as the output member 40a (FIG. 2) and the eighteen (18) output members preceding the output member 40a when the analog value is "19". The circuit 60 for the output member 40a includes an "AND" network 62 which receives a signal on a line 64 corresponding to the line 48 (FIG. 2) for the third row and also receives a signal on a line 66 corresponding to the line 50 (FIG. 2) for the third column. As a result, the "AND" network 62 in FIG. 3 provides an output when the third row and the third column (defining the output member 40a) become prepared for activation.

The output signal from the "AND" network 62 is introduced to an "OR" network 68 which also receives the input from a line 70. The output from the "OR" network 68 is introduced to an inverter 72 and the output from the inverter 72 is passed to a line 74. The signal on the line 74 activates the output member 40a.

The output member 40a is activated when signals simultaneously pass through the lines 64 and 66 to the "AND" network 62. All of the output members 40 in the rows preceding the output member 40a become simultaneously activated. This is obtained by introducing the signal from the line 74 for the output member 40a to a line (corresponding to the line 70 for the output member 40a) associated with each of the output members in the preceding rows.

In addition to activating all of the output members in the first and second rows, the first and second output members in the third row are simultaneously activated when the output member 40a becomes activated. The activation of the first two members in the third row may be obtained by introducing the signal on the line 74, through a line corresponding to the line 70, to the "or" network (corresponding to the network 68) for each of the first and second output members in the third row.

As will be seen from FIG. 3, the output member 40a and all of the output members preceding the output member 40a are simultaneously energized when the analog value is "19". Each of the energized output members 40 produces a substantially constant current when energized as by circuitry shown in FIG. 3. These constant currents in the different output members are accumulated in a single output line to provide on this output line a current having a magnitude corresponding to the analog value of "19" in the example discussed in the previous paragraphs. Since this output current is obtained from a number of output members 40 each providing a substantially constant current, the output from the converter shown in FIG. 2 is monotonic. As will be appreciated, the constant current through each of the energized output members 40 is provided by the circuit shown in FIG. 1.

As will be appreciated, the circuits for activating the output members in the top row in FIG. 2 do not need the line 70 in FIG. 3. This results from the fact that there are no preceding rows of output members to be activated when the output members in the top row in FIG. 2 are being activated. Furthermore, the lines corresponding to the line 66 (FIG. 3) can receive an activating voltage at all times for the output members in the first column in FIG. 1. This results from the fact that the output member common to the first column and a particular row is activated when any of the output members in that row is activated. This output member remains activated regardless of which output member in the row is thereafter activated.

The circuitry shown in FIG. 1 may include certain portions of the converter shown in FIGS. 2 and 3 and described above. This is illustrated schematically by semi-conductors 80, 82 and 84. Each of the semi-conductors 80, 82 and 84 may be an n-type and may include a source, a drain and a gate. The semi-conductor 80 may be conductive for a particular row and the semi-conductor 82 may be conductive for a particular column. The semi-conductor 84 may receive a signal on its gate from a line corresponding to the line 70 in FIG. 3. As previously described, this signal is produced for each output member when such output member is to be activated because an output member of higher value has been activated.

The semi-conductors 80, 82 and 84 are included in a branch, generally indicated at 86, which is connected across the semi-conductor 14. The drains of the semi-conductors 80 and 82 are connected to the source of the semi-conductor 14, and the sources of the semi-conductors 80 and 82 and the drain of the semi-conductor 84 have a common connection.

When no current flows through the branch 86, the constant current flows through the semi-conductors 20, 16 and 14. This corresponds to a binary value of "0" in the particular output member in the converter. However, when the branch 86 becomes conductive, the constant current flows through the semi-conductors 20 and 16 and the branch 86 and no current flows through the semi-conductor 14. This corresponds to a binary value of "1" in the particular output member in the converter. Since the constant current continues to flow through the semi-conductor 16 even with changes in the binary value between logic levels of "1" and "0", no voltage glitches are produced in the voltages across the semi-conductors 20 and 16, during such changes in the binary value, as a result of the effects of distributed capacitances in the semi-conductors, and particularly the distributed capacitances in the semi-conductor 16.

The circuit shown in FIG. 1 and the converter shown in FIGS. 2 and 3 may be included on an integrated circuit chip generally indicated at 90 in FIG. 4. This integrated circuit chip may be manufactured by a number of different suppliers including VLSI Technology. Since the semi-conductors 14 and 16 are disposed on the same chip, they can be provided with the relative characteristics specified above.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing a regulated flow of current,
   a first semi-conductor,
   a second semi-conductor constituting a native device relative to the first semi-conductor,
   a third semi-conductor,
   the first, second and third semi-conductors being connected in a series circuit,
   means for biasing the third semi-conductor to a state of conductivity, and
   means for commonly biasing the first and second semi-conductors to obtain a saturated flow of current through the first and second semi-conductors when the third semi-conductor is conductive.

2. In a combination as set forth in claim 1,
   the first and second semi-conductors being constructed to provide threshold voltages having a particular voltage difference and to provide the same voltage across them in the saturated state of conductivity of these transistors.

3. In a combination as set forth in claim 1,
   control means connected across the first semi-conductor and having first and second states of operation to provide for the flow of the saturated current through the first semi-conductor in the first state of operation and to divert the saturated flow of current from the first semi-conductor to the control means in the second state of operation of the control means.

4. In combination for providing a regulated flow of current on an integrated circuit chip,
   a first semi-conductor,
   a second semi-conductor constituting a native device relative to the first semi-conductor,
   the first and second semi-conductors being constructed to provide threshold voltages having a substantially constant voltage difference between them and to provide substantially constant voltages in each of the first and second semi-conductors in the saturated state of conductivity of the first and second semi-conductors,
   means connected to the second semi-conductor for producing a flow of current through the second semi-conductor, and
   means for commonly biasing the first and second semi-conductors to maintain a saturated flow of current through the first and second semi-conductors, in accordance with the differences in the threshold voltages of the semi-conductors, when current flows through the semi-conductors.

5. In a combination as set forth in claim 4,
   the first and second semi-conductors being connected in series and the current-producing means being connected in series with the first and second semi-conductors.

6. In a combination as set forth in claim 4, means for introducing a voltage to the current-producing means to make the current-producing means conductive, and the current-producing means being connected in a circuit with the second semi-conductor to provide for a flow of current through the second semi-conductor when the current-producing means is conductive.

7. In a combination as set forth in claim 6,
the current-producing means and the first and second semi-conductors being connected in a series relationship.

8. In a combination as set forth in claim 7,
control means connected across the first semi-conductor and having first and second states of operation and operative in the first state to provide for the flow of the saturated current through the second and first semi-conductors and operative in the second state to provide for the flow of the saturated current through the second semi-conductor and the control means.

9. In combination for providing a regulated flow of current,
a first semi-conductor having a gate, a source and a drain and providing a first threshold voltage, the first semi-conductor being made from ion implantations,
a second semi-conductor having a gate, a source and a drain and made by the same process as the first semi-conductor and providing a second threshold voltage different by a substantially constant value than the first threshold voltage,
the second semi-conductor receiving a particular number of ion implantations different than the first semi-conductor,
a third semi-conductor having a drain, a source and a gate,
means for introducing an energizing voltage to the source of the third semi-conductor,
means for biasing the gate of the third semi-conductor relative to the source of the third semi-conductor to provide for a flow of current through the third semi-conductor,
means for connecting the first, second and third semi-conductors in a series circuit, and
means for providing a common bias to the first and second semi-conductors to insure a saturated flow of current through these semi-conductors when current flows through the third semi-conductor.

10. In a combination as set forth in claim 9,
the series circuit being formed by connecting the drain of the third semi-conductor and the source of the second semi-conductor and by connecting the drain of the second semi-conductor to the source of the first semi-conductor.

11. In a combination for providing a regulated flow of current,
a first semi-conductor having first, second and third electrodes, the first semi-conductor having a first threshold voltage,
a second semi-conductor having first, second and third electrodes, the second semi-conductor being a native device and having a second threshold voltage different by a particular value from the first threshold voltage,
the third electrode of the second semi-con,ductor being connected to the first electrode of the first semi-conductor, means connected to the first electrode of the second semi-conductor for providing a flow of current to such electrode, and
means for commonly biasing the second electrodes of the first and second semi-conductors to produce a flow of a saturated current through the second and first semi-conductors when a current flows to the first electrode of the second semi-conductor.

12. In a combination as set forth in claim 11,
control means connected to the first electrode of the first semi-conductor and having first and second states of operation to provide for the flow of the saturated current through the first and second semi-conductors in the first state of operation of the control means and to provide for the flow of the saturated current through the second semi-conductor and the control means in the second state of operation of the control means.

13. In a combination as set forth in claim 12,
the current-providing means constituting a third semi-conductor and the third semi-conductor being biased to produce a flow of current through the third and second semi-conductors.

14. In a combination as set forth in claim 13,
the first, second and third semi-conductors being connected in series, and
means for introducing a voltage to the third semi-conductor to energize the semi-conductors.

15. In a combination as set forth in claim 11,
each of the first and second semi-conductors being constructed to have substantially the same voltage drop across the semi-conductors in the saturated state of operation of the semi-conductors.

16. In combination for providing a regulated flow of current,
a first semi-conductor having a first threshold voltage,
a second semi-conductor having a second threshold voltage different by a particular amount from the first threshold voltage,
means for producing a flow of current through the second semi-conductor,
means for connecting the first and second semi-conductors to provide for a flow of current through the first semi-conductor when current flows through the second semi-conductor, and
means for commonly biasing the first and second semi-conductors to produce a flow of a saturated current through the first and second semi-conductors when current flows through these semi-conductors.

17. In a combination as set forth in claim 16,
control means having first and second states of operation and connected to the first semi-conductor to obtain the flow of the saturated current through the second semi-conductor in the first state of operation of the control means and to obtain the flow of the saturated current through the second semi-conductor and the first semi-conductor in the second state of operation of the control means.

18. In a combination as set forth in claim 16,
a digital-to-analog converter having a plurality of binary bits arranged in rows and columns,
means for activating a particular row in the converter,
means for activating a particular column in the converter to obtain the energizing of a bit common to the particular row and the particular column, means for activating the bits in the rows preceding the energized bit, means for activating the bits preceding the energized bit in the row including the energized bit, the control means including:

the means activating the particular row being in parallel with the means for activating the particular column and in series with the means for activating the bits preceding the energized bit in the row including the energized bit.

19. In combination for providing a regulated flow of current, a plurality of bits arranged in rows and columns, means for activating a particular row, means for activating a particular column, to obtain an energizing of a bit common to the particular row and the particular column, means for connecting the activating means for the row in parallel with the activating means for the column, means for activating the bits preceding the energized bits in the same row as the energized bit, means for connecting the last mentioned means in series with the parallel arrangement to form a control means having first and second states of operation, a first semi-conductor having a first threshold voltage and having a particular threshold voltage, a second semi-conductor constituting a native device, the second semi-conductor having a second threshold voltage different from the first threshold by a particular value, means for connecting the first and second semi-conductors in a circuit, means for producing a flow of current through the second semi-conductor, the control means being connected across the first semi-conductor, and means for commonly biasing the first semi-conductor and the second semi-conductor to obtain a flow of saturated current through the second semi-conductor and the first semi-conductor in the first state of operation of the control means and to obtain a flow of saturated current through the second semi-conductor and the control means in the second state of operation of the control means.

20. In a combination as set forth in claim 19, the means providing the flow of current through the second semi-conductor including a third semi-conductor and further including means providing an energizing voltage to the third semi-conductor.

21. In a combination as set forth in claim 20, the voltage means and the third, second and first semi-conductors being connected in series.

22. In a combination as set forth in claim 21, means for biasing the third semi-conductor to a state of conductivity, each of the first, second and third semi-conductors having a gate, drain and source, the gate of the first and second semi-conductors being commonly biased and the gate of the third semi-conductor being biased to produce a flow of current through the third semi-conductor and the drain and source of the first, second and third semi-conductors being connected in series.

* * * * *